(12) United States Patent
Tipton et al.

(10) Patent No.: US 12,140,630 B2
(45) Date of Patent: Nov. 12, 2024

(54) METHOD OF FINDING OPTIMIZED ANALOG MEASUREMENT HARDWARE SETTINGS AS WELL AS METHOD OF MEASURING A DEVICE UNDER TEST

(71) Applicant: Rohde & Schwarz GmbH & Co. KG, Munich (DE)

(72) Inventors: Darren Tipton, Munich (DE); Michael Simon, Munich (DE); Florian Ramian, Munich (DE); Martin Breinbauer, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 370 days.

(21) Appl. No.: 17/547,681

(22) Filed: Dec. 10, 2021

(65) Prior Publication Data

US 2023/0184832 A1  Jun. 15, 2023

(51) Int. Cl.
*G01R 31/319* (2006.01)
*G01R 31/3185* (2006.01)

(52) U.S. Cl.
CPC ........... *G01R 31/31901* (2013.01); *G01R 31/318575* (2013.01)

(58) Field of Classification Search
CPC .......... G01R 31/31901; G01R 31/318575
See application file for complete search history.

(56) References Cited

U.S. PATENT DOCUMENTS

| | | | | |
|---|---|---|---|---|
| 6,359,429 B1* | 3/2002 | Arai | .................. | G01R 23/16 |
| | | | | 324/76.23 |
| 7,313,492 B2* | 12/2007 | Ortler | .................. | G01R 23/173 |
| | | | | 324/76.23 |
| 8,565,343 B1* | 10/2013 | Husted | .................. | H04B 1/0475 |
| | | | | 455/114.3 |
| 9,606,212 B1* | 3/2017 | Martens | .................. | G01R 35/005 |
| 2021/0341526 A1* | 11/2021 | Dunsmore | .................. | G01R 31/3191 |

OTHER PUBLICATIONS

Extending the Useable Range of Error Vector Magnitude (EVM) Testing) (Year: 2012).*
Christopher D. Ziomek (Extending the Useable Range of Error Vector Magnitude (EVM) Testing) (Year: 2012).*
Ziomek, C.D. and M.T. Hunter, "Extending the Useable Range of Error Vector Magnitude (EVM) Testing," ZTEC Instruments, Inc., Albuquerque, New Mexico, USA, 5 pages.

* cited by examiner

*Primary Examiner* — Manish S Shah
*Assistant Examiner* — Sharad Timilsina
(74) *Attorney, Agent, or Firm* — CHRISTENSEN O'CONNOR JOHNSON KINDNESS PLLC

(57) ABSTRACT

Embodiments of the present disclosure relate to methods of finding optimized analog measurement hardware settings of a measurement system for a target measurement. The method can include one or more of the following steps: applying initial settings to the measurement system; varying the settings over a power sweep while processing a test signal used for the target measurement or a representative signal; performing the target measurement during the power sweep, thereby determining a hardware contribution of the measurement system over the power sweep; and identifying the respective settings that lead to a minimum hardware contribution of the measurement system at various powers.

11 Claims, 4 Drawing Sheets

METHOD OF FINDING OPTIMIZED ANALOG MEASUREMENT HARDWARE SETTINGS AS WELL AS METHOD OF MEASURING A DEVICE UNDER TEST

FIELD OF THE DISCLOSURE

Embodiments of the present disclosure generally relate to methods of finding optimized analog measurement hardware settings of a measurement system for target measurement. Further, embodiments of the present disclosure generally relate to methods of measuring a device under test.

BACKGROUND

In the state of the art, it is known to find optimized settings for a measurement system such that a respective target measurement of a device under test can be performed by the measurement system in an optimized manner, which means that the measurement system itself does not have an influence on the measurement result. Accordingly, a respective characteristic of the device under test can be gathered in a reliable manner.

So far, the optimized settings of the measurement system are obtained by a so-called brute-force approach, wherein several different settings of the measurement system are tried for a certain setup, e.g. the target measurement including the waveform and frequency of the respective signal used, in order to identify the optimized settings of the measurement system. In other words, this approach corresponds to a "trial and error"-approach since several different settings are applied.

However, this approach requires a lot of time, as the respective settings have to be found for each individual target measurement, thereby increasing the costs and duration required for testing a device under test.

Accordingly, there is a need for an improved method to identify optimized analog measurement hardware settings of a measurement system so as to reduce the efforts associated with finding the optimized settings.

SUMMARY

Embodiments of the present disclosure provide methods of finding optimized analog measurement hardware settings of a measurement system for a target measurement. In an embodiment, a method comprises the steps of:

Applying initial settings to the measurement system,
Varying the settings over a power sweep while processing a test signal used for the target measurement or a representative signal,
Performing the target measurement during the power sweep, thereby determining a hardware contribution of the measurement system over the power sweep, and
Identifying the respective settings that lead to a minimum hardware contribution of the measurement system at various powers.

Accordingly, settings of the measurement system can be obtained that ensure optimal modulation quality measurements at any frequency, level and bandwidth while having minimal contribution from the measurement system to the measurement results obtained. In some embodiments, the respective method corresponds to a calibration of the measurement system, which may take place only once every few weeks. Accordingly, the overall efforts can be reduced significantly that are required for maintaining the measurement system in a calibrated state. For instance, an error vector magnitude (EVM) impact of the measurement system on the EVM measurement of a device under test is minimized due to the optimal settings of the measurement system, which are obtained by the method, mentioned above particularly optimal settings for the radio frequency (RF) and intermediate frequency (IF) stages.

In general, fast EVM measurements can be performed since the overall time required is reduced. Additionally, a low variation of measurement results is ensured when using the measurement system with the optimized settings.

The representative signal that may be used instead of the test signal that corresponds to the one used during the target measurement. However, the representative signal has similar properties with respect to bandwidth and amplitude distribution compared with the test signal.

In some embodiments, the respective behavior of the measurement system may be checked for that particular waveform and its amplitude distribution, e.g., a high crest factor could have an impact.

An aspect provides that settings are saved that lead to a low hardware contribution of the measurement system at specific power levels. Therefore, the respective settings for specific power levels used during the power sweep are saved such that these setting can be accessed later, e.g., loaded, for being used in a subsequent target measurement of a device under test, namely at the specific power levels for which the settings have been stored.

Another aspect provides that the specific power levels correspond to the ones that will be used when performing the target measurement of a device under test. The specific power levels may depend on the respective target measurement and/or the device under test that undergoes the target measurement.

For instance, the target measurement may relate to an error vector magnitude (EVM) measurement, an adjacent channel leakage power ratio (ACLR) measurement, a spectrum emission mask (SEM) measurement, a third order intermodulation (TOI) measurement, or a measurement of harmonics. Generally, the target measurement may be anything sensitive to the dynamic range, which might require demodulation.

In some embodiments, the EVM measurement may be done by using a digital signal from a vector signal generator (VSG), wherein a demodulated signal is obtained from the receiver, wherein the EVM can be calculated. Hence, the respective settings can be derived by finding the minimum EVM.

Generally, it would only be necessary to do a power measurement of the device under test, thereby identifying the specific power level such that the respective settings stored previously can be applied to the measurement system. This ensures that the hardware contribution of the measurement system to the measurement result(s) is minimized. In some embodiments, no demodulation is necessary when performing the target measurement on the device under test.

The settings may comprise a setting for at least one attenuator of the measurement system, a setting for a reference level used by the measurement system, and/or a setting of at least one pre-amplifier of a measurement system. Accordingly, the settings may comprise a setting for a single attenuator or several attenuators. Further, the settings may comprise a setting for a single pre-amplifier or several pre-amplifiers. These different settings may be varied during the power sweep so as to identify the optimized settings concerning these parameters.

Generally, the settings may depend on the waveform and/or frequency of the test signal used in the target measurement. Thus, the respective method may be done for different waveforms and frequencies to be used for performing the target measurement separately. Moreover, the settings may also depend on a pre-amplifier gain setting such that the respective method is also conducted for each different pre-amplifier gain setting of the measurement system.

Accordingly, the settings may only comprise a setting for the attenuator and a setting for the reference level, wherein the respective settings also depend on the pre-amplifier gain setting. In different words, the pre-amplifier gain setting may not be varied while varying the setting for the attenuator and the setting for the reference level in order to find optimized settings of the measurement system with respect to these parameters.

Any of the methods described above may be performed for each pre-amplifier gain setting of a certain waveform and frequency. In other words, for a certain waveform and frequency, the above-mentioned method, namely the finding of optimized settings, is done for each of several different pre-amplifier gain settings separately. Hence, the number of iterations of these methods inter alia depends on the number of gain stages provided.

The power sweep may be a stepped power sweep such that the power is altered in a stepwise manner during the power sweep. Accordingly, a certain power level is applied wherein the settings are varied for the respective power level in order to identify the optimized settings at the certain power level that lead to a minimum hardware contribution of the measurement system. Afterwards, the power level is increased by a certain power level step wherein the settings are varied again in order to identify the optimized settings that lead to a minimum hardware contribution of the measurement system at the respective power level, namely the increased power level. These steps are repeated for all different power levels that shall be taken into account.

As mentioned above, the power level is generally increased in a stepwise manner, wherein the respective power level steps have the same step size. Hence, the power level is increased by the same amount of power during each iteration.

Functional dependencies of the settings with respect to the power level may be determined. These functional dependencies ensure that only the respective power level has to be measured in a subsequent testing of the device under test. In other words, doing a power measurement is sufficient in order to arrive at the respective settings that ensure minimum contribution of the measurement system by using the functional dependency.

Another aspect provides that at least one additional component is added to the measurement system, which is also taken into consideration when finding the optimized settings. The calibration plane can be moved accordingly due to the at least one additional component. The at least one additional component may be an amplifier, a filter and/or a switch (matrix).

In some embodiments, the calibration can be extended with respect to external components.

Further, embodiments of the present disclosure also provide methods of measuring a device under test. In some embodiments, any of the methods of finding optimized analog measurement hardware settings of a measurement system for a target measurement as described above is performed initially. Hence, optimized settings to be applied for the target measurement are obtained. The obtained settings are applied for at least one specific power level.

Accordingly, it is ensured that the optimized setting are applied that are associated with the specific power level at which the target measurement of the device under test shall take place. Any impact of the measurement system on the target measurement, namely the measurement result(s) is minimized effectively, as the optimized settings determined previously are applied.

For instance, the target measurement may relate to an error vector magnitude (EVM) measurement, thereby minimizing the contribution of the EVM of the measurement system on the EVM of the device under test.

An aspect of the disclosure provides that a power measurement of the device under test is performed prior to applying the obtained settings, wherein the power measurement of the device under test reveals an output power of the device under test. Accordingly, it is verified at which specific power level the target measurement of the device under test takes place so as to ensure that the corresponding optimized settings are applied so as to minimize the hardware contribution. Therefore, optimal modulation quality measurements can be performed, namely at any frequency, level and bandwidth.

In some embodiments, the settings may be applied that match with the output power of the device under test. As mentioned above, this ensures that the measurement system has a minimized contribution on the measurement result(s) of the target measurement.

In general, it is ensured that for each different target measurement to be performed, it is only necessary to do a power measurement of the respective device under test at the beginning in order to ensure that the optimized settings can be loaded that have been identified previously during the method of finding optimized settings of the measurement system for the respective target measurement. This reduces the overall efforts required significantly. In some embodiments, it is not necessary to do a demodulation for each individual test, as it is sufficient to set the respective parameters associated with the settings in an appropriate manner with respect to the specific power level that may match with the output power of the device under test.

In some embodiments, the measurement system may comprise a signal analyzer. The signal analyzer may process/analyze the test signal during the target measurement.

In some embodiments, the test signal is outputted by the device under test.

As mentioned above, a representative signal may be used as an alternative. Thus, generic waveform(s) can be used which have similar properties to the test signal(s) planned for the target measurement. For instance, a noise signal with similar properties with regard to bandwidth and amplitude distribution can be used as a representative signal for the calibration, e.g. finding the optimized settings of the measurement system.

In general, a widest possible EVM curve for the measurement system, for example an analyzer, can be used due to the improved calibration of the measurement system.

In addition, the quality of the measurement result(s), namely the data obtained, is improved significantly since the contribution of the measurement system to the measurement result(s) is minimized due to the similar properties with bandwidth and amplitude distribution as a representative calibration, namely the optimized settings for the respective target measurement.

Furthermore, the life span of the respective components of the measurement system is significantly improved, as the number of switching is reduced of each individual component, namely of the RF or IF stages and/or amplifier(s). Moreover, the attenuators are stressed less compared to the calibration techniques known in the state of the art.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed. Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

Figure 1:
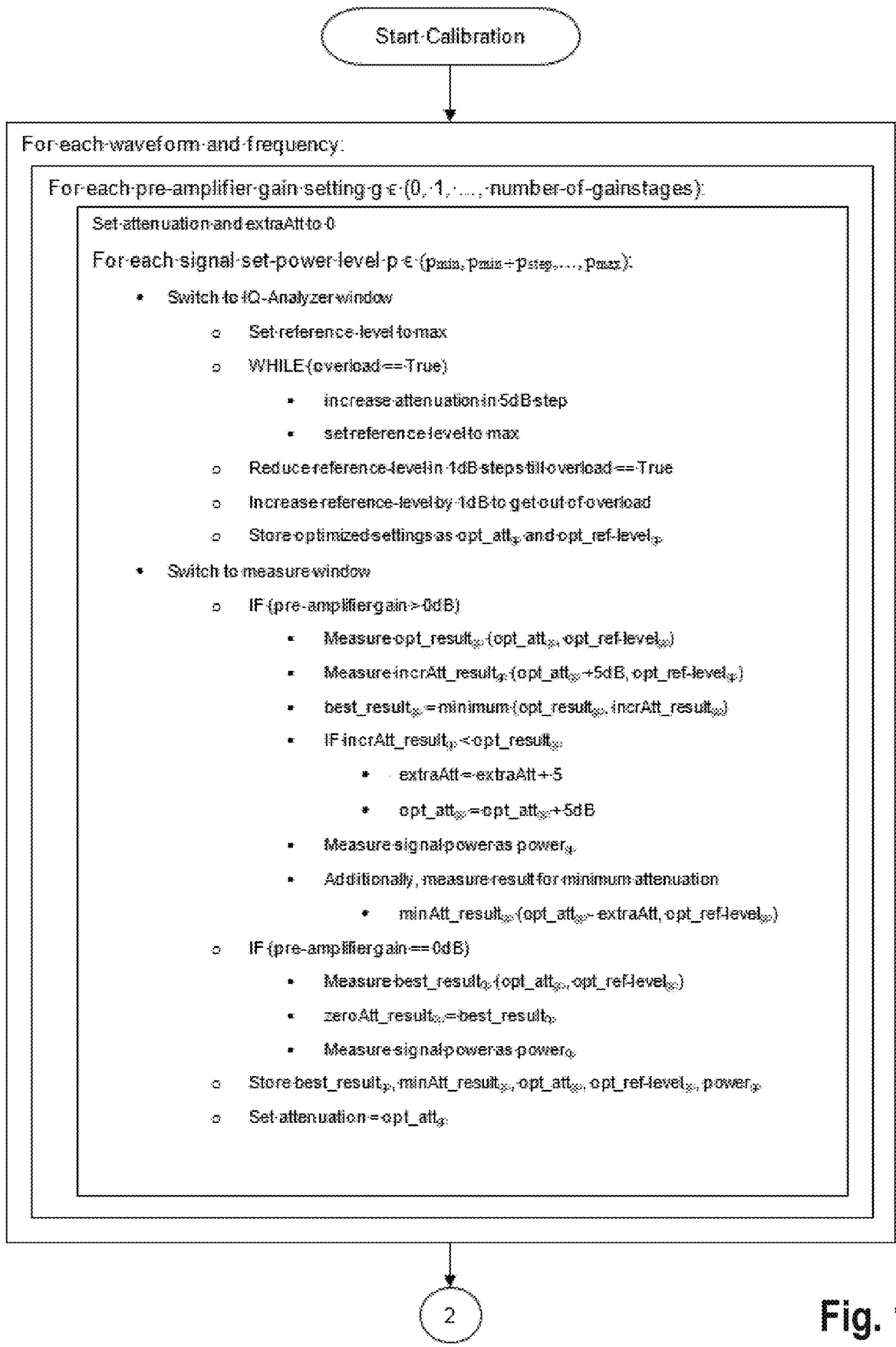
FIG. 1 schematically shows a flow-chart that illustrates a first part of a method of finding optimized analog measurement hardware settings of a measurement system for a target measurement according to an embodiment of the present disclosure, FIG. 2 schematically shows a flow-chart that illustrates a second part of a method of finding optimized analog measurement hardware settings of a measurement system for a target measurement according to an embodiment of the present disclosure, FIG. 3 schematically shows a flow-chart that illustrates a method of measuring a device under test according to an embodiment of the present disclosure.
Figure 2:
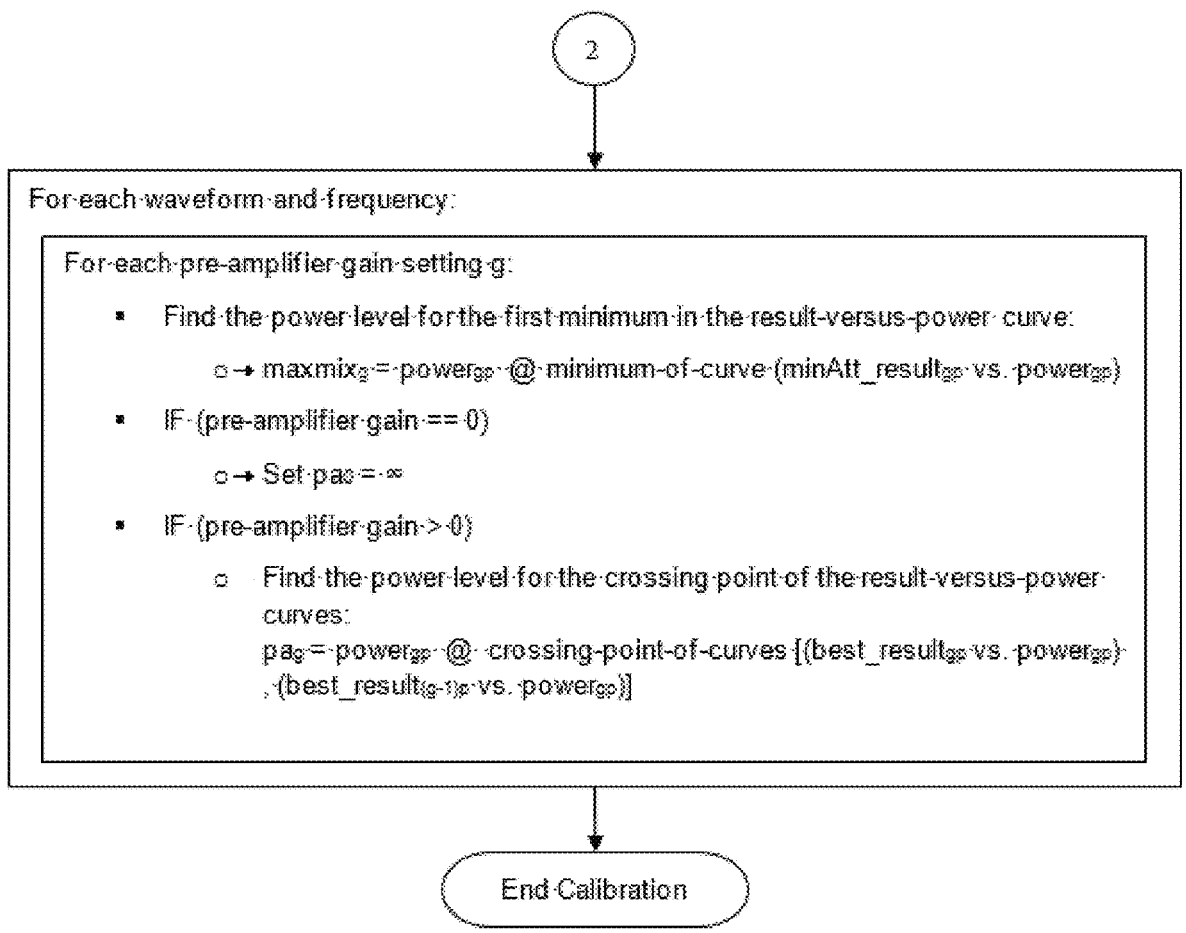

In FIGS. 1 and 2, a flow-chart is shown that shows a representative method of finding optimized analog measurement hardware settings of a measurement system that is used for performing a target measurement on a device under test. In some embodiments, the respective method corresponds to a calibration method, as settings are identified that ensure proper operation of the measurement system such that the measurement system has a minimal contribution on a target measurement on the device under test, which is to be performed by the measurement system, for example the measurement result(s) obtained by the target measurement.

As shown in FIGS. 1 and 2, the respective steps indicated are performed for each waveform and frequency to be planned for performing the respective target measurement(s). In addition, the respective steps are also performed for each pre-amplifier gain setting "g" of the measurement system.

In other words, several different pre-amplifier gain settings "g" may be provided by the measurement system that have to be taken into account for the specific waveform and frequency, namely the test signal planned for target measurement. Alternatively, to the test signal, a representative signal may be used that has similar characteristics compared with the test signal. Therefore, reference is made to the waveform, e.g., amplitude distribution, and frequency of the respective signal.

At the beginning, namely the start of the calibration procedure, initial settings are applied to the measurement system. These initial settings may relate to a setting of the attenuation as well as a setting of an extra attenuation ("extraAtt"). As shown in FIG. 1, both the attenuation and the extra attenuation ("extraAtt") are set to zero initially.

Further, a reference level ("reference-level") may be set, namely to its maximum which is also shown in FIG. 1. Moreover, a certain power level is set, e.g., a minimum power level $p_{min}$ at the beginning of the calibration procedure, namely the method of finding optimized analog measurement hardware settings of a measurement system for a target measurement.

Then, the respective settings are varied over a power sweep while processing the test signal planned for the target measurement or a representative signal that has similar properties, for example with regard to bandwidth and amplitude distribution compared with the test signal, as already described above.

Generally, the settings may relate to a setting for at least one attenuator of the measurement system ("attenuation") and/or a setting for a reference level of the measurement system ("reference-level").

In the shown example, the attenuation may be increased by 5 dB steps, whereas the reference level is increased and/or reduced by 1 dB steps in order to get out of an overload or rather increase the reference level to the overload. The step size may be altered. Hence, finer step sizes can be applied if wanted.

In general, the step size for the attenuation may be denoted by "n dB", whereas the step size for the reference level may be denoted by "y dB".

By doing so, the optimized settings for the attenuation and reference level are identified, namely "opt_att$_{gp}$" and "opt_ref-level$_{gp}$", which depend on the respective pre-amplifier gain setting "g" and power level "p" as indicated by the index "gp". Thus, the optimized settings for the attenuation and reference level are identified, namely "opt_att$_{gp}$" and "opt_ref-level$_{gp}$", are identified for specific power levels.

As shown in FIG. 1, the respective power sweep relates to a stepped power sweep, as the power level is altered in a stepwise manner during the power sweep. This means that the power level is varied in a continuous manner, for instance by adding a certain power step level $p_{step}$ to the previous power level. Hence, the power level is increased from the minimum $p_{min}$ to a maximum $p_{max}$ in a stepwise manner, wherein each previous power level is increased by the same power step level $p_{step}$.

For each of the different power levels obtained during the power sweep, the respective settings are varied accordingly in order to identify initially optimized settings for the attenuation and reference level, namely "opt_att$_{gp}$" and "opt_ref-level$_{gp}$", at each of the different power levels.

In addition, for each power level "p" of the several power levels encompassed by the power sweep, a respective pre-amplifier gain setting "g" is also taken into account as indicated by the index "gp" of the optimized settings.

Further, the respective target measurement is performed for each of the different power levels while applying the initial optimized settings "opt_att$_{gp}$" and "opt_ref-level$_{gp}$".

The respective target measurement may be performed differently depending on the pre-amplifier gain setting "g", namely depending on whether the pre-amplifier gain setting equals 0 dB or is higher than 0 dB. For a pre-amplifier gain setting "g" being higher than 0 dB, a measurement result with the initially optimized settings ("opt_att$_{gp}$" and "opt_ref-level$_{gp}$") is obtained, namely "opt_result$_{gp}$". This can be also expressed as follows: opt_result$_{gp}$ (opt_att$_{gp}$, opt_ref-level$_{gp}$).

In addition, a measurement for an incremented attenuation is done, wherein the previously determined optimized attenuation "opt_att$_{gp}$" is increased by a 5 dB step, thereby obtaining the result "incrAtt_result$_{gp}$", which can be expressed as follows: incrAtt_result$_{gp}$ (opt_att$_{gp}$+5 dB, opt_ref-level$_{gp}$).

As mentioned above, the respective step size may be different, for example finer than 5 dB.

Afterwards, the best result ("best_result$_{gp}$") is identified by determining the minimum between the optimum result ("opt_result$_{gp}$") and the result of the incremented attenuation ("incrAtt_result$_{gp}$"), namely: best_result$_{gp}$=minimum (opt_result$_{gp}$, incrAtt_result$_{gp}$).

In case the result of the incremented attenuation ("incrAtt_result$_{gp}$") is lower than the optimum result ("opt_result$_{gp}$"), e.g., a lower contribution of the measurement system to the target measurement result is provided, the initial setting of the extra attenuation ("extraAtt") is increased by 5 dB such that: extraAtt=extraAtt+5.

Further, the initial optimum attenuation setting opt_att$_{gp}$ is also increased by 5 dB, namely: opt_att$_{gp}$=opt_att$_{gp}$+5 dB.

As mentioned above, the respective step size may be different, for example finer than 5 dB.

Then, the signal power can be measured, thereby obtaining power$_{gp}$ for the respective pre-amplifier gain setting "g" and the respective power level "p" as indicated by the index "gp".

In addition, the result for a minimum attenuation ("minAtt_result$_{gp}$") is measured, namely minAtt_result$_{gp}$ (opt_att$_{gp}$-extraAtt, opt_ref-level$_{gp}$).

Accordingly, the best result ("best_result$_{gp}$") as well as the result associated with a minimum attenuation ("minAtt_result$_{gp}$") are obtained in case that the pre-amplifier gain setting "g" is higher than 0 dB.

In case of a pre-amplifier gain setting "g" that equals 0 dB, the respective attenuation value ("zeroAtt_result$_{0p}$") is associated with the best result ("best_result$_{0p}$") obtained for the respective pre-amplifier gain setting. In some embodiments, the respective best result was measured for the initially optimized settings "opt_att$_{gp}$" and "opt_ref-level$_{gp}$", namely "best_result$_{0p}$ (opt_att$_{gp}$, opt_ref-level$_{gp}$). Hence, "zeroAtt_result$_{0p}$"="best_result$_{0p}$".

Then, the signal power can be measured for the pre-amplifier gain setting "g" that equals 0 dB, thereby obtaining power$_{0p}$ for the respective pre-amplifier gain setting of 0 dB and the respective power level as indicated by the index "0p".

Afterwards, the respective results and settings obtained from the above, namely "best_result$_{gp}$", "minAtt_result$_{gp}$", "opt_att$_{gp}$", -opt_ref-level$_{gp}$" as well as "power$_{gp}$" are obtained and stored for further processing.

As mentioned above, the respective settings are obtained for each of the individual power levels provided during the power sweep and, furthermore, for each pre-amplifier gain setting "g".

The attenuation of the measurement system is set to "opt_att$_{gp}$" that may equal the initial setting for the attenuation or the altered one as described above.

Finally and as shown in FIG. 2, the respective settings are identified that lead to a minimum hardware contribution of the measurement system at various powers, wherein the respective steps are again performed for each waveform and frequency as well as for each pre-amplifier gain setting "g".

First, a power level for the first minimum in the result-versus power curve is identified as follows: maxmix$_g$=power$_{gp}$@the minimum of the curve ("minAtt_result$_{gp}$" vs. "power$_{gp}$").

Thus, a curve is obtained by the above-mentioned results and/or settings obtained as described above, namely ("minAtt_result$_{gp}$" vs. "power$_{gp}$". The respective curve obtained is further processed so as to identify the minimum in the respective curve, wherein the respective power level power$_{gp}$ corresponds to the parameter "maxmix$_g$" used afterwards.

In case of a pre-amplifier gain setting "g" that equals 0 dB, the pre-amplifier gain setting pa$_0$ can be set to infinity. In case of a pre-amplifier gain setting "g" being higher than zero, a power level ("pa$_g$") has to be identified at the crossing point of the result-versus power curves as follows: pa$_g$=power$_{gp}$@the crossing points of curves [(best_result$_{gp}$ vs. power$_{gp}$), (best_result$_{(g-1)p}$ vs. power$_{gp}$)].

Hence, two curves are determined, namely curve (best_result$_{gp}$ vs. power$_{gp}$) as well as curve (best_result$_{(g-1)p}$ vs. power$_{gp}$). Then, the crossing point of both curves is identified so as to determine the respective power level at the crossing point of both curves.

Accordingly, the settings maxmix$_g$ as well as pa$_g$ are identified that can be derived from the respective curve(s) mentioned above, namely by the minimum and the crossing point of the respective curves.

Figure 3:
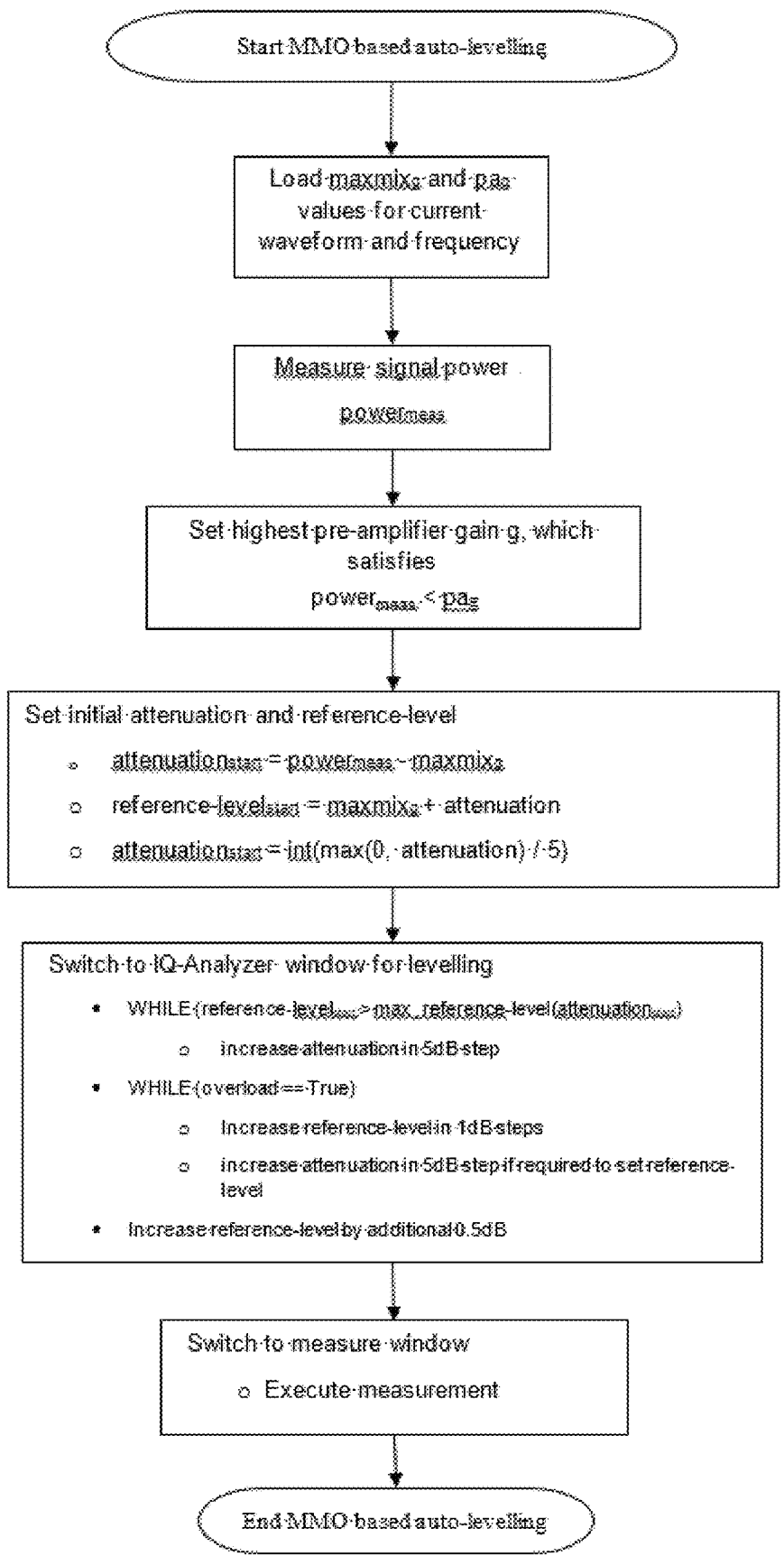

Hence, further test settings are obtained, namely maxmix$_g$ and pa$_g$, which are applied when performing the target measurement of the device under test as shown in FIG. 3 to which reference is made hereinafter.

In FIG. 3, a flow-chart is shown that illustrates a representative method of measuring the device under test, namely by performing the target measurement with a certain signal having a defined waveform and frequency.

The further test settings indicated above, namely maxmix$_g$ and pa$_g$, are loaded for the respective waveform and frequency of the signal used for testing, e.g., the test signal. Then, a signal power power$_{meas}$ is measured so as to identify the output power of the device under test.

Afterwards, the highest pre-amplifier gain is set, which satisfies the condition power$_{meas}$<pa$_g$. Then, initial attenuation and reference-level settings are set as follows, wherein the settings and measurements performed previously are used:

$$\text{attenuation}_{start} = \text{power}_{meas} - \text{maxmix}_g$$

$$\text{reference-level}_{start} = \text{maxmix}_g + \text{attenuation}$$

$$\text{attenuation}_{start} = \text{int}(\max(0, \text{attenuation})/5)$$

As indicated above, the parameter/characteristic "attenuation" was set to equal "opt_att$_{gp}$"; (See FIG. 1).

Afterwards, the attenuation is increased by 5 dB steps as long as "reference-level$_{start}$" is still higher than the maximum of the reference-level for the initial attenuation, namely "max_reference-level(attenuation$_{start}$)".

In case of an overload, "reference-level" is increased in 1 dB steps, whereas "attenuation" is increased in 5 dB steps if required to set the reference-level.

Then, the reference-level is increased by additional 0.5 dB.

In the end, the target measurement on the device under test is executed.

FIG. 3 shows that it is only necessary to measure the signal power ("$power_{meas}$") such that the optimized settings for the measurement system can be obtained for the respective target measurement. Accordingly, it is no more necessary to do a demodulation at this stage.

Figure 4:
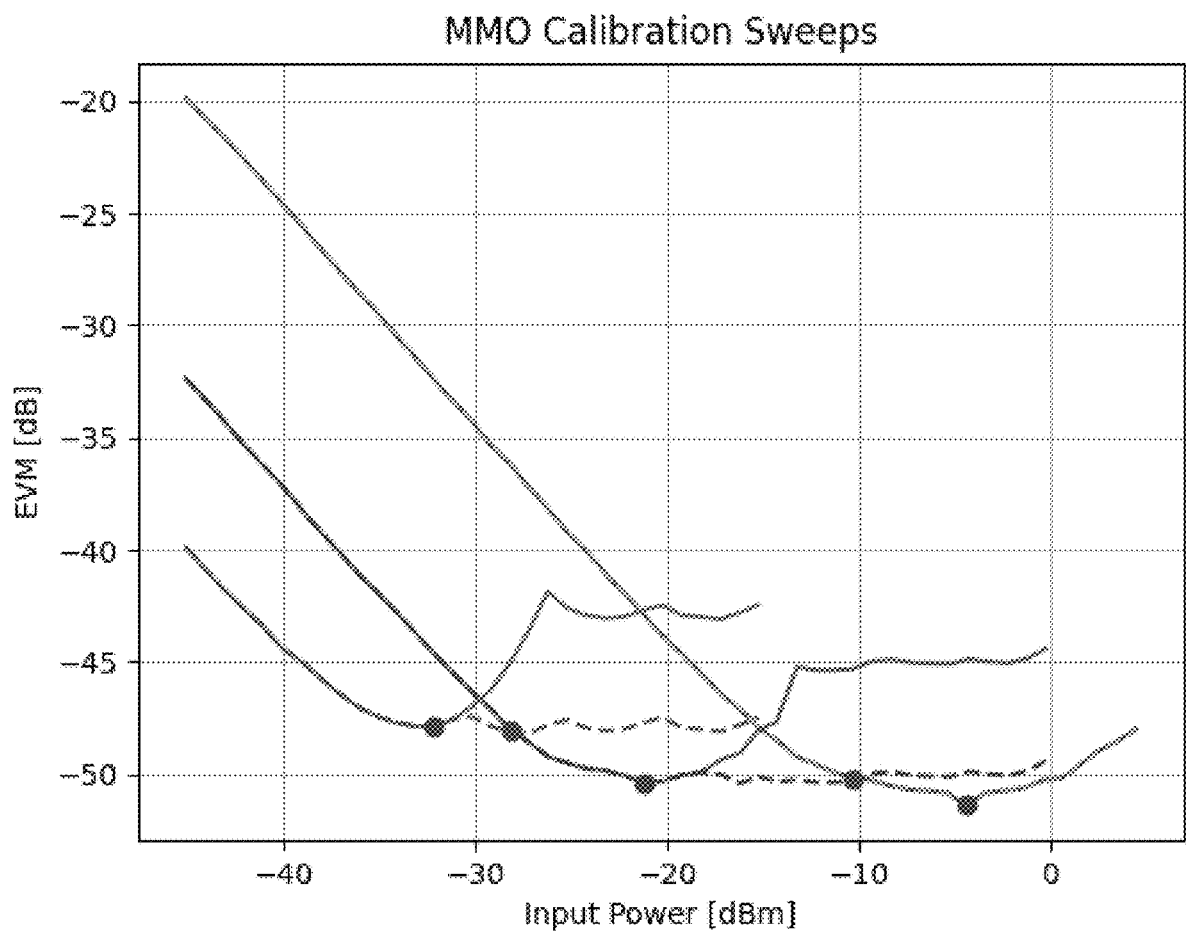
FIG. 4 shows a diagram that indicates the contribution of different measurement systems over a power sweep.

In FIG. 4, different calibration sweeps for different setups of the measurement system are shown, wherein it is indicated that the minimum contribution of the measurement system to the measurement result(s) is identified by determining the minimum of the respective curve(s).

Generally, at least one additional component may be added to the measurement system, resulting in a different setup of the measurement system. The additional component is also taken into consideration when finding the optimized settings. Hence, the calibration plane can be shifted due to the at least one additional component. The additional component may be for example an amplifier, a filter and/or a switch (matrix).

Certain embodiments disclosed herein utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof.

In an embodiment, circuitry includes hardware circuit implementations (e.g., implementations in analog circuitry, implementations in digital circuitry, and the like, and combinations thereof). In an embodiment, circuitry includes combinations of hardware circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors, such as, for example, microprocessors, or portions thereof and accompanying software, firmware, hardware, and the like.

In some examples, the functionality described herein can be implemented by special purpose hardware-based computer systems or circuits, etc., or combinations of special purpose hardware and computer instructions. Each of these special purpose hardware-based computer systems or circuits, etc., or combinations of special purpose hardware circuits and computer instructions form specifically configured circuits, devices, etc., capable of implemented the functionality described herein.

Embodiments of the present disclosure may also take the form of an apparatus, system, computing device, computing entity, and/or the like executing instructions stored on computer-readable storage media to perform certain steps or operations. The computer-readable media include cooperating or interconnected computer-readable media, which exist exclusively on a processing or processor system or distributed among multiple interconnected processing or processor systems that may be local to, or remote from, the processing or processor system. However, embodiments of the present disclosure may also take the form of an entirely hardware embodiment performing certain steps or operations.

Various embodiments are described above with reference to block diagrams and/or flowchart illustrations of apparatuses, methods, systems, and/or computer program instructions or program products. It should be understood that each block of any of the block diagrams and/or flowchart illustrations, respectively, of portions thereof, may be implemented in part by computer program instructions, e.g., as logical steps or operations executing on one or more computing devices. These computer program instructions may be loaded onto one or more computer or computing devices, such as special purpose computer(s) or computing device(s) or other programmable data processing apparatus(es) to produce a specifically-configured machine, such that the instructions which execute on one or more computer or computing devices or other programmable data processing apparatus implement the functions specified in the flowchart block or blocks and/or carry out the methods described herein.

These computer program instructions may also be stored in one or more computer-readable memory or portions thereof, such as the computer-readable storage media described above, that can direct one or more computers or computing devices or other programmable data processing apparatus(es) to function in a particular manner, such that the instructions stored in the computer-readable memory produce an article of manufacture including computer-readable instructions for implementing the functionality specified in the flowchart block or blocks.

It will be appreciated that the term computer or computing device can include, for example, any computing device or processing structure, including but not limited to a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof.

Accordingly, blocks of the block diagrams and/or flowchart illustrations support various combinations for performing the specified functions, combinations of operations for performing the specified functions and program instructions for performing the specified functions. Again, it should also be understood that each block of the block diagrams and flowchart illustrations, and combinations of blocks in the block diagrams and/or flowchart illustrations, or portions thereof, could be implemented by special purpose hardware-based computer systems or circuits, etc., that perform the specified functions or operations, or combinations of special purpose hardware and computer instructions.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

Throughout this specification, terms of art may be used. These terms are to take on their ordinary meaning in the art from which they come, unless specifically defined herein or the context of their use would clearly suggest otherwise.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method of finding optimized analog measurement hardware settings of a measurement system for a target measurement, the method comprising:
    applying initial settings to the measurement system;
    varying the settings over a power sweep while processing a test signal used for the target measurement or a representative signal;
    performing the target measurement during the power sweep, thereby determining a hardware contribution of the measurement system over the power sweep; and
    identifying the respective settings that lead to a minimum hardware contribution of the measurement system at various powers, wherein the power sweep is a stepped power sweep such that the power is altered in a stepwise manner during the power sweep.

2. The method of claim 1, wherein settings are saved that lead to a low hardware contribution of the measurement system at specific power levels.

3. The method of claim 2, wherein the specific power levels correspond to the ones that will be used when performing the target measurement of a device under test.

4. The method of claim 1, wherein the settings comprise a setting for at least one attenuator of the measurement system, a setting for a reference level used by the measurement system, and/or a setting of at least one pre-amplifier of a measurement system.

5. The method of claim 1, wherein the settings applied on the waveform and/or frequency of the test signal used in the target measurement.

6. The method of claim 1, wherein functional dependencies of the settings with respect to the power level are determined.

7. The method of claim 1, wherein at least one additional component is added to the measurement system, which is also taken into consideration when finding the optimized settings.

8. A method of measuring a device under test, wherein the method of finding optimized analog measurement hardware settings of a measurement system for a target measurement according to claim 1 is performed, thereby obtaining optimized settings to be applied for the target measurement, and wherein the obtained settings are applied for at least one specific power level.

9. The method of claim 8, wherein a power measurement of the device under test is performed prior to applying the obtained settings, and wherein the power measurement of the device under test reveals an output power of the device under test.

10. The method of claim 9, wherein the settings are applied that match with the output power of the device under test.

11. A method of measuring a device under test, the method comprising:
    finding optimized analog measurement hardware settings of a measurement system for a target measurement, wherein said finding optimized analog measurement hardware settings includes:
        applying initial settings to the measurement system;
        varying the settings over a power sweep while processing a test signal used for the target measurement or a representative signal;
        performing the target measurement during the power sweep, thereby determining a hardware contribution of the measurement system over the power sweep; and
        identifying the respective settings that lead to a minimum hardware contribution of the measurement system at various powers;
    performing a power measurement of the device under test, wherein the power measurement of the device under test reveals an output power of the device under test; thereafter
    applying said identified settings for at least one specific power level, wherein said identified settings are applied that match with the output power of the device under test.

* * * * *